United States Patent [19]

Einthoven

[11] 3,999,217
[45] Dec. 21, 1976

[54] SEMICONDUCTOR DEVICE HAVING PARALLEL PATH FOR CURRENT FLOW

[75] Inventor: Willem Gerard Einthoven, Belle Mead, N.J.

[73] Assignee: RCA Corporation, New York, N.Y.

[22] Filed: Feb. 26, 1975

[21] Appl. No.: 553,151

[52] U.S. Cl. .................................. 357/68; 357/65; 357/55; 357/86
[51] Int. Cl.² .................. H01L 23/48; H01L 29/06
[58] Field of Search ................ 357/65, 68, 86, 55

[56] References Cited
UNITED STATES PATENTS

| | | | |
|---|---|---|---|
| 3,617,828 | 11/1971 | Daniluk | 357/86 |
| 3,676,229 | 7/1972 | Einthoven et al. | 357/86 |
| 3,735,358 | 5/1973 | Ho | 357/86 |
| 3,858,233 | 12/1974 | Miyata et al. | 357/68 |

*Primary Examiner*—Edward J. Wojciechowicz
*Attorney, Agent, or Firm*—H. Christoffersen; R. P. Williams; R. A. Hays

[57] ABSTRACT

To lower the resistance to current flow from, e.g., the base region to the base terminal lead, a channel of a conductivity type opposite to that of the base region, and of higher conductance, is disposed within the base region underlying the metal layer contact on the surface of the device. The metal layer contacts both the base region and the channel to electrically short the PN junction therebetween.

5 Claims, 2 Drawing Figures

SEMICONDUCTOR DEVICE HAVING PARALLEL PATH FOR CURRENT FLOW

This invention relates to semiconductor devices, and particularly to such devices including a body of semiconductor material having one or more elongated metal paths on a surface thereof.

In certain semiconductor devices, particularly power transistors, at least one of the regions of the semiconductor body, generally the base region, is of a somewhat winding, elongated shape for the purpose of maximizing the length of the junction between the base and emitter regions. As known, this provides higher current capabilities of the devices.

The elongated base region is overlaid and contacted along its length with a layer of metal which serves to conduct current from the various portions of the base region to a terminal lead connected to a part thereof. To avoid excessive voltage drops along this metal layer connector, it is preferably of a relatively high conductance, i.e., it has a relatively large cross-sectional area. A problem with this, however, is that with certain types of devices it is quite difficult to provide relatively thick metal layers, and the use of wide metal layers requires the use of large area semiconductor bodies, thus increasing the costs of the devices. A need exists, therefore, for a means for increasing the conductance of the paths for current while not increasing the cross-sectional area of the metal current carrying layers.

Figure 1:
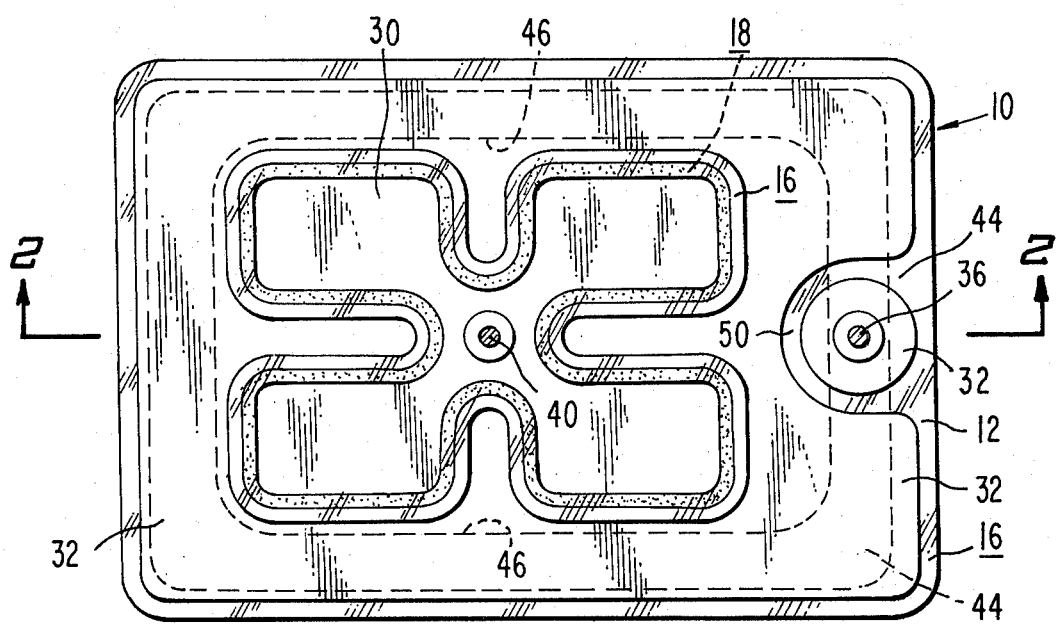
FIG. 1 is a plan view of a device made in accordance with this invention.
Figure 2:
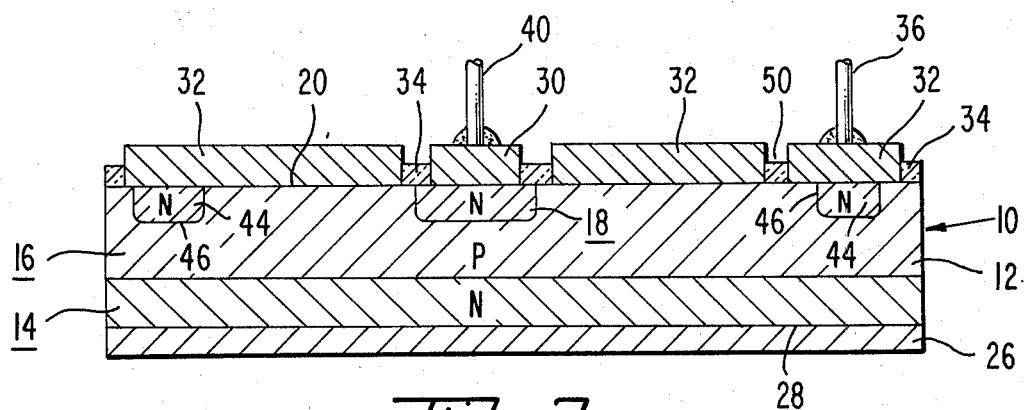
FIG. 2 is a cross-sectional view taken along line 2—2 of FIG. 1.

With reference to FIGS. 1 and 2, a semiconductor device 10 is shown comprising a body 12 of semiconductor material, e.g., silicon, including a collector region 14 of, in this embodiment, N type conductivity, a base region 16 of P type conductivity, and an emitter region 18 of N type conductivity, the emitter region 18 being strippled in FIG. 1 for greater clarity. As shown in FIG. 2, both the emitter region 18 and the base region 16 extend to a surface 20 of the semiconductor body, and, as shown in FIG. 1, the base region 16 substantially surrounds the emitter region 18 at the surface 20. For generally known reasons, the base region 16 is made relatively long and narrow, i.e., it is quite elongated.

Various metal layers are provided on surfaces of the semiconductor body to serve as electrodes of the device. Thus, a metal layer 26 on the bottom surface 28 (FIG. 2) is directly connected with the collector region 14 and comprises the collector electrode. An emitter electrode comprises a metal layer 30 overlying the emitter region 18, and a base electrode comprises a metal layer 32 overlying and in direct contact with the base region 16.

Where the surface 20 of the body 12 is not directly contacted by a metal layer, it is coated with a layer 34 of a protective material, e.g., silicon dioxide.

A base terminal lead 36 is attached, as by soldering, to the base region metal layer 32, and an emitter terminal lead 40 is similarly attached to the emitter region metal layer 30. As shown, a gap 50 is provided through the layer 32 close to the terminal lead 36. The purpose of this gap is described below.

Paths for current from the various portions of the elongated base region 16 to the base region terminal lead 36 are through the base region 16 itself and through the layer 32 of metal overlying and contacting the base region 16. For efficient operation of the transistor device 10, as is generally known, the voltage drop caused by the flow of base current to the base region terminal lead 36 is preferably as small as possible, preferably below 50 millivolts.

In accordance with this invention, the resistance to base current flow to the terminal lead 36 is reduced by including within the base region 16 an elongated channel 44 of higher conductivity material than that of the surrounding base region material. The channel 44 is of a conductivity type opposite to that of the base region 16, is spaced from the emitter region 18, generally underlies the metal layer 32, and is shorted to the base region 16 by the metal layer 32. In this embodiment, with a base region 16 of P type conductivity, the channel 44 is of N type conductivity. Preferably, as shown in the drawings, the elongated channel 44 substantially surrounds the emitter region 18. Further, it is preferred that the base electrode 32 and the elongated channel 44 are elongated in substantially the same direction.

The channel 44, of higher conductivity than the remainder of the base region 16, provides an additional path for base region current to the terminal lead 36, thus allowing the use of a smaller cross-sectional area metal layer 32. The channel 44, in effect, provides a path for current in parallel to that of the metal layer 32. Being of a conductivity type opposite to that of the base region 16, the channel 44 is separated from the base region 16 by a rectifying or PN junction 46 therebetween. The PN junction 46 is electrically shorted, however, thus providing an ohmic and low resistance path for base current from the base region 16 into the channel 44 by the metal layer 32 which overlies substantially the entire length of the PN junction 46 where it intercepts the surface 20.

The channel 44 is preferably disposed substantially directly beneath the metal layer 32. This arrangement, in contrast to one, for example, where the channel 44 extends substantially out from under the metal layer 33, i.e., to one side thereof, minimizes the body surface area taken up by the paths for current to the base terminal lead 36 and is generally preferred for this reason.

The reason the channel 44 is of opposite type conductivity to that of the base region 16 is as follows. In semiconductor devices comprising emitter and base regions, the emitter regions are commonly made of a significantly higher conductivity than that of the base regions for reasons of higher emitter injection efficiency. Thus, by forming the channel 44 simultaneously with, and with identical conductivity characteristics as the emitter region 18, an adequately high conductivity channel 44 can generally be provided with no extra fabricating steps or costs in comparison with making the same device without the channel. Known photolithographic and diffusion techniques can be used.

In one embodiment, for example, the base region 16 comprises an epitaxially deposited layer having a uniform resistivity of 10 ohm-cm and a thickness (between the collector region 14 and the surface 20 of the body 12) of about 20 microns. The emitter region 18 is formed by diffusion of phosphorus at a surface concentration of about $10^{20}/cm^3$ to a depth of about 10 microns, and has a sheet resistance of about 0.5 ohm per square.

The channel 44, having the same depth and conductivity characteristics as those of the emitter region 18, has a width of 175 micrometers and a length of about 5 millimeters. The layer 32 comprises a thin film of nickel, e.g., about 200 A thick, in direct contact with the surface 20 of the body 12, the nickel film being overlaid with solder, e.g., 95% lead, 5% tin, by weight, to a thickness of about 5 micrometers.

As shown in FIG. 1, the channel 44 extends continuously around the edge of the body 12 and underlies the terminal lead 36. The metal layer 32, as previously noted, contains a gap 50 therethrough near the lead 36. The gap 50 prevents flow of solder from the portion of the layer 32 separated from the terminal lead 36 by the gap 50 to the terminal lead 36 during the soldering of the terminal lead to the body 12. Such flow, if not prevented, tends to reduce the thickness of the layer 32 (the solder flowing onto the lead 36) and causes a corresponding increase in the resistance of the layer. While not shown, a similar gap can be provided separating the terminal lead 40 from the metal layer 30 overlying the emitter region 18.

The invention is not limited to use in transistor devices but may have use in other devices, e.g., devices of the type known as "thyristors".

What is claimed is:

1. A semiconductor device comprising:
   a body of semiconductor material and a first region within said body,
   a terminal lead and an elongated electrode for conducting current between said first region and said lead, and
   an elongated second region within said body providing a parallel path for current between said lead and said first region, said elongated second region being of higher conductivity than and being of a conductivity type opposite to that of said first region, said elongated electrode providing an ohmic contact between said first region and said elongated second region, said elongated electrode and said elongated second region being elongated in substantially the same direction.

2. A semiconductor device as in claim 1 including an emitter region of the same conductivity characteristics and type as that of said elongated second region, said first region comprising a base region of said device.

3. A semiconductor device as in claim 1 wherein said elongated electrode and said elongated second region are in overlapped relation over substantially the entire length of said elongated second region.

4. A semiconductor device as in claim 3 wherein said elongated electrode is disposed on a surface of said body, and said elongated second region extends to said surface and into contact thereat with said elongated electrode.

5. A semiconductor device as in claim 2 wherein said elongated second region substantially surrounds said emitter region.

* * * * *